US006906508B1

(12) United States Patent
Saulnier et al.

(10) Patent No.: US 6,906,508 B1
(45) Date of Patent: Jun. 14, 2005

(54) COMPONENT TESTING SYSTEM VACUUM RING AND TEST PLATE CONSTRUCTION

(75) Inventors: Christian R. Saulnier, Boutigny (FR); James G. Gasque, Vista, CA (US)

(73) Assignee: Ceramic Component Technologies, Inc., Vista, CA (US)

( * ) Notice: Subject to any disclaimer, the term of this patent is extended or adjusted under 35 U.S.C. 154(b) by 0 days.

(21) Appl. No.: 10/733,902

(22) Filed: Dec. 11, 2003

(51) Int. Cl.[7] .............................................. G01R 31/02
(52) U.S. Cl. .................................... 324/158.1; 324/755
(58) Field of Search ................................ 324/754–755, 324/758, 765, 158.1; 439/70; 361/230–235, 756, 799

(56) References Cited

U.S. PATENT DOCUMENTS

| | | | | |
|---|---|---|---|---|
| 4,669,416 A | * | 6/1987 | Delgado et al. | ............ 118/503 |
| 5,337,893 A | * | 8/1994 | Nami et al. | ................... 206/722 |
| 5,781,400 A | * | 7/1998 | Takahashi et al. | .......... 361/234 |
| 5,842,579 A | | 12/1998 | Garcia et al. | |
| 5,886,863 A | * | 3/1999 | Nagasaki et al. | ........... 361/234 |
| 6,194,679 B1 | | 2/2001 | Garcia et al. | |
| 6,204,464 B1 | | 3/2001 | Garcia et al. | |
| 6,710,611 B2 | * | 3/2004 | Saulnier et al. | ............. 324/755 |

* cited by examiner

Primary Examiner—Minh N. Tang
(74) Attorney, Agent, or Firm—Loyal McKinley Hanson

(57) ABSTRACT

A vacuum ring on a component testing system includes a metallic base material defining a vacuum-communicating passageway. A ceramic layer on the base material, preferably 20–100 micrometers thick and formed by a micro-arc oxidation process resulting in molecular adhesion, improves abrasion resistance and makes the vacuum ring more arc-over proof. A test plate for holding DUTs includes such a ceramic layer that provides better wear while enabling use of the base as a guard layer during testing. Another aspect of the invention concerns a vacuum ring having an eject hole pattern for discharging compressed gas toward DUTs in order to eject DUTs from a test plate. The eject hole pattern includes a plurality of closely spaced apart holes, each measuring less than the size that would be large enough to receive a DUT having the predetermined minimum cross sectional area.

3 Claims, 4 Drawing Sheets

COMPONENT TESTING SYSTEM VACUUM RING AND TEST PLATE CONSTRUCTION

BACKGROUND OF THE INVENTION

1. Technical Field

This invention relates generally to the batch processing of miniature electronic circuit components, including passive, two-terminal, ceramic capacitors, resistors, inductors, and the like. More particularly, it concerns a vacuum ring and a test plate that are used on a component testing system for holding such components or other type of device under test (DUT) as part of the batch processing for purposes of parametric testing.

2. Description of Related Art

The tiny size of electronic circuit components of interest herein complicates processing. Typically fabricated of ceramic material in parallelepiped shapes having dimensions as small as 0.020" by 0.010" by 0.010" more or less, these difficult-to-handle components require appropriate equipment and precision handling techniques. During testing, such a component is sometimes referred to as a device under test (DUT).

U.S. Pat. No. 6,194,679 describes a testing machine for such DUTs. The testing machine in that patent is similar in some respects to the testing machine available from Electro Scientific Industries, Inc. (ESI) of Portland, Oreg. as its model ESI-3300. Among other things, the testing machine includes a component-holding part that is referred to herein as a "test plate" and a vacuum-communicating part that is referred to herein as a "vacuum ring." The test plate is mounted rotatably over the vacuum ring where it functions as means for receiving and hold a batch of DUTs. The vacuum ring (sometimes called a vacuum plate) couples a vacuum to the test plate that helps hold the test plate and load the DUTs onto the test plate. As the test plate rotates relative to the vacuum ring, various test are performed. After testing, DUTs are blown out of the test plate into various containers according to the test results.

Although effective in many respects, there are some concerns related to the vacuum ring and the test plate. One is wear. Ceramic powder and loose ceramic pieces from DUTs can abrade the surface of the vacuum ring that faces the test plate. The vacuum ring, typically fabricated of nickel-plated steel, must eventually be replaced as a result (as much as two or three times a year).

In addition, testing may involve voltages on the order of 1000 volts. Various forms of grease, grime, dirt, dust and other electrically conductive material on the vacuum ring and/or on the insulation material around the lower contact provide unwanted conductive paths. Arc-overs occur, and repeated arc-overs can damage the vacuum ring and even the expensive power supplies.

DUT size differences introduce another concern. The vacuum ring includes what are referred to as eject holes or blow holes that are formed in the vacuum ring by milling, drilling, or other mechanical process. Compressed air coupled to an eject hole at just the right time serves to blow a DUT from the test plate into a sorting box according to test results. But, different size DUTs require different pressure (i.e., blowout force). Little DUTs require little eject holes for less blowout force while bigger DUTs require bigger eject holes for greater blowout force. As a result, various vacuum rings must be kept available and substituted on the test machine according to DUT size.

Each of these concerns adds time and expense to DUT testing. Thus, a need exists for an improved vacuum ring and test plate construction so that the vacuum ring is more abrasion resistant, the vacuum ring is more arc-over proof, and differing DUT sizes are better. accommodated.

SUMMARY OF THE INVENTION

This invention addresses the concerns outlined above by providing a vacuum ring and test plate construction such that the vacuum ring and test plate include a base material (e.g., aluminum) and ceramic layer (e.g., alumina) covering the surface of the base material. The ceramic layer is hard and more abrasion resistant. It is also electrically non-conductive and more arc-over proof.

In addition, one embodiment of the vacuum ring includes an eject hole that better accommodates different DUT sizes. The eject hole is actually a pattern of tiny laser-machined holes such that littler DUTs cover or occlude fewer holes for less blowout force while bigger DUTs cover more holes for greater blowout force (i.e., ejection force).

To paraphrase some of the more precise language appearing in the claims and further introduce the nomenclature used, a vacuum ring for use in conjunction with a test plate on a component testing system includes a metallic base material that defines at least one vacuum-communicating passageway. The metallic base material has a test-plate-facing first surface and means are provided for improving abrasion resistance of the vacuum ring. For that purpose, a ceramic layer is disposed on the test-plate-facing first surface of the metallic base material.

In one embodiment, the metallic base material is composed of aluminum and the ceramic layer is composed of alumina that is usually no less than 20 micrometers thick and no greater than about 100 micrometers thick. Preferably, the ceramic layer is bonded to the metallic base material by molecular adhesion using a micro-arc oxidation process.

A test plate constructed according to another aspect of the invention for holding DUTs includes a DUT-holding structure that defines at least one DUT-receiving hole. The DUT-holding structure is composed at least partially of a metallic material that has oppositely facing first and second outer surfaces. A ceramic layer disposed on at least the first outer surface of the DUT-holding structure improves abrasion resistance of the test plate. In one embodiment, the DUT-holding structure includes an internal wall that defines the DUT-holding hole and the ceramic layer (electrically nonconductive) covers both the first and second surfaces and the internal wall in order to enable use of the DUT-holding structure as a guard layer that is held to at a selected electrical potential for testing purposes.

According to yet another aspect of the invention, there is provided a vacuum ring for use in conjunction with a test plate on a component testing system for testing DUTs. The vacuum ring includes a base with an eject hole pattern for discharging compressed gas toward the DUTs in order to eject DUTs from the test plate. Each DUT has a cross sectional area less than a predetermined minimum cross sectional area and the eject hole pattern is sized accordingly. The eject hole pattern includes a plurality of closely spaced apart individual holes such that each of the individual holes has a cross sectional area that is somewhat less than the size that would be large enough to receive a DUT having the predetermined minimum cross sectional area. With that arrangement, the number of holes affecting a particular DUT for DUT ejection purposes is dependent on the cross sectional size of that particular DUT. The holes may take any of various forms, including being circular, oval, or elongate slots.

Thus, the invention provides an improved vacuum ring and test. plate construction such that the vacuum ring and test plate are more abrasion resistant, the vacuum ring is more arc-over proof, and differing DUT sizes are better accommodated. The following illustrative drawings and detailed description make the foregoing and other objects, features, and advantages of the invention more apparent.

DESCRIPTION OF THE PREFERRED EMBODIMENTS

Figure 1:
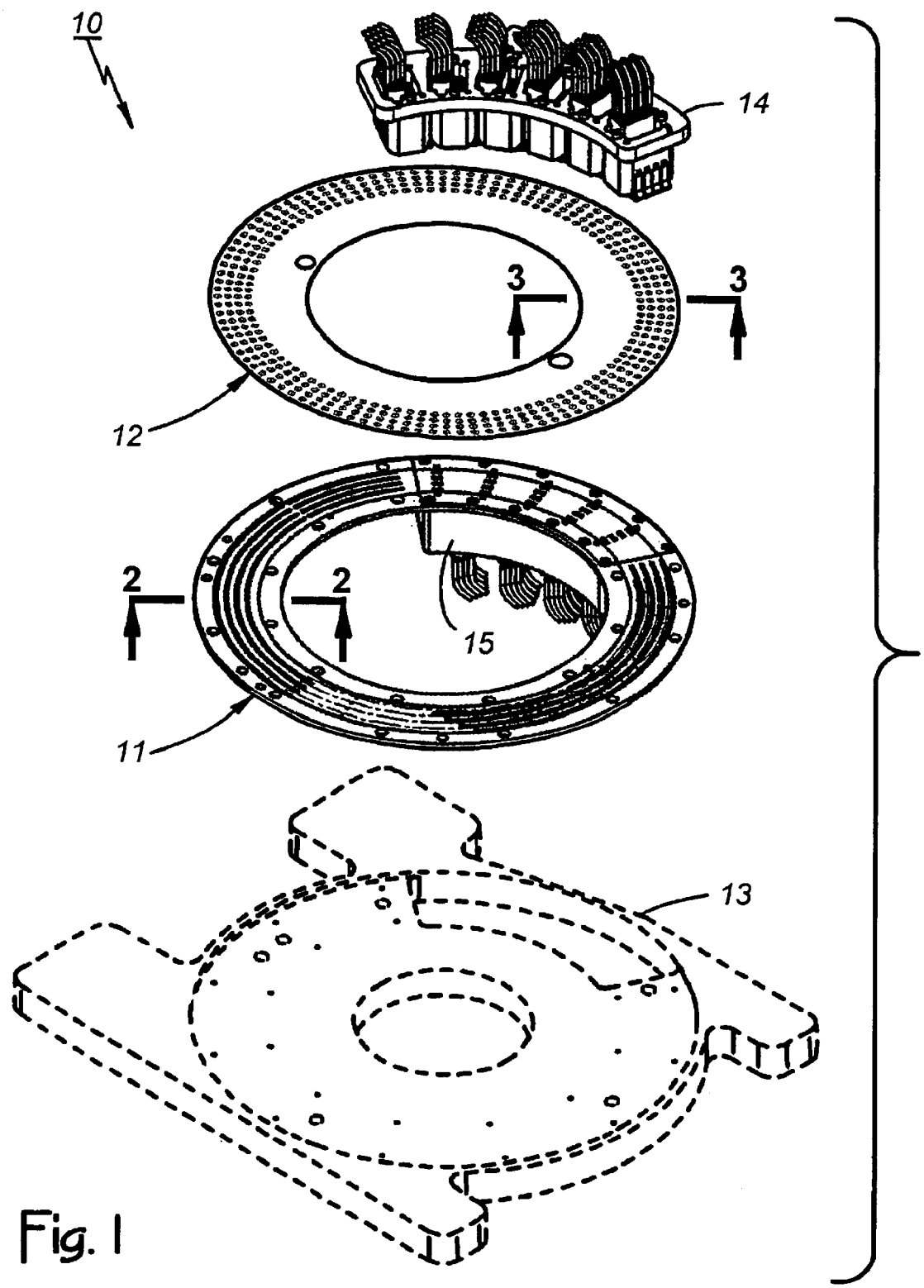
FIG. 1 of the drawings is an exploded up view of some parts of a component testing machine, including a vacuum ring and a test plate that are constructed according to the invention.

FIG. 1 of the drawings shows a component testing system 10 that includes a vacuum ring 11 (a vacuum-communicating part) and a test plate 12 (a component-holding part) that are constructed according to the invention. The testing system 10 is similar in some respects to the testing machine described in U.S. Pat. No. 6,194,679 and the testing machine in that patent is similar in some respects to the testing machine available from Electro Scientific Industries, Inc. (ESI) of Portland, Oreg. as its model ESI-3300.

The component testing system 10 includes what is sometimes called a base plate 13 on which the vacuum ring 11 is mounted. The test plate 12 mounts rotatably over the vacuum ring 11 where it functions as means for receiving and hold a batch of DUTs. The vacuum ring 11 operates in conjunction with the test plate 12 in a known way to couple a vacuum source (not shown) on the component testing system 10 to the test plate 12 and DUT-holding holes in the test plate 12.

Thus, the vacuum ring 11 couples a vacuum to the test plate 12 that helps hold the test plate 12 and helps load the DUTs onto the test plate 12. As the test plate 12 rotates relative to the vacuum ring 11, various test are performed. For that purpose, upper and lower contactor assemblies 14 and 15 operate to electrically contact terminals on DUTs held in DUT-holding holes as the test plate 12 rotates.

After testing, DUTs are blown out of the test plate 12 into various containers (not shown) according to the test results. However, as the test plate 12 rotates relative to the vacuum ring 11, ceramic dust and particles from DUTs move across the vacuum ring 11 in an abrasive manner. The test plate 12 is similarly affected and so the abrasion resistance provided by this invention is desirable in order to limit replacement requirement.

Figure 2:
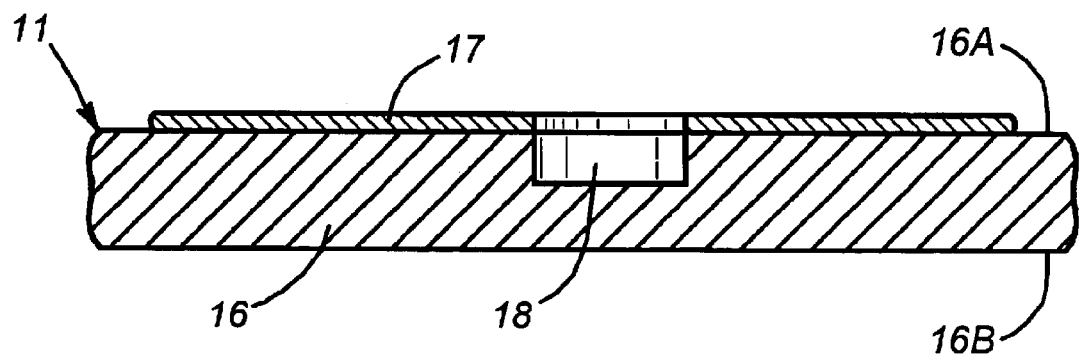
FIG. 2 is a cross sectional elevation view of a portion of the vacuum ring as viewed in a vertical plane containing a line 2—2 in FIG. 1.

To achieve the desired abrasion resistance, the vacuum ring 11 includes a metallic base material 16 (e.g., aluminum) on which a ceramic layer 17 (e.g., alumina) is disposed (FIG. 2). The base material includes a test-plate-facing first surface 16A and an opposite second surface 16B. In operation, the first surface 16A faces upwardly toward the test plate 12 while the second surface 16B faces downwardly away from the test plate 12.

To function as a vacuum ring, the base material 16 defines at least one vacuum-communicating passageway 18. The ceramic layer 17 is disposed on the test-plate-facing first surface 16A so that the vacuum-communicating passageway 18 is exposed. So disposed, the ceramic layer 17 functions as means for improving abrasion resistance of the vacuum ring 11 by improving abrasion resistance of the first surface 16A. Of course, the second surface 16B (and other parts of the vacuum ring 11) can also coated with a ceramic layer (not shown) for even more wear resistance and for convenience of fabrication.

FIG. 2 is not drawn to scale. The thickness of the base material 16 and the thickness of the ceramic layer are exaggerated for illustrative purposes. However, the thickness of the illustrated base material 16 is about one-eighth inch while the thickness of the ceramic layer 17 fall is the a range of about 20 micrometers to about 100 micrometers.

Preferably, the ceramic layer 17 is bonded to the metallic base material 16 by molecular adhesion. For that purpose, the illustrated ceramic layer 17 is formed on the metallic base material 16 by a known micro-arc oxidation process. The base material 16 is immersed in an electrolytic bath (water and highly dilute electrolyte) after which an electric current is applied to generate a series of micro-arcs on the surface of the object that result in oxidation by micro-arcs. The micro-arcs pierce the layer of hydrated oxides covering the object, and the holes produced are then filled by the formation of a hard, ceramic-type oxide (the ceramic layer 17) which, in the case of aluminum, is composed mainly of crystalline aluminum (i.e., alumina).

The electrical process described above grows a somewhat thick, high quality ceramic layer 17 (on the order of 20 to 100 micrometers thick) on the base material 16. Unlike the chrome and nickel plating processes, no metal is added, and there is no waste liquid to be processed. Furthermore, the coating is more robust than others, because the hard outer layer (i.e., the ceramic layer 17) is bonded to the aluminum (the base material 16) by molecular adhesion. Further details of the above process are available from Mofratech Company of Seynod, France under the trademark ALTIM TD. The process can also be used on titanium and magnesium.

Figure 3:
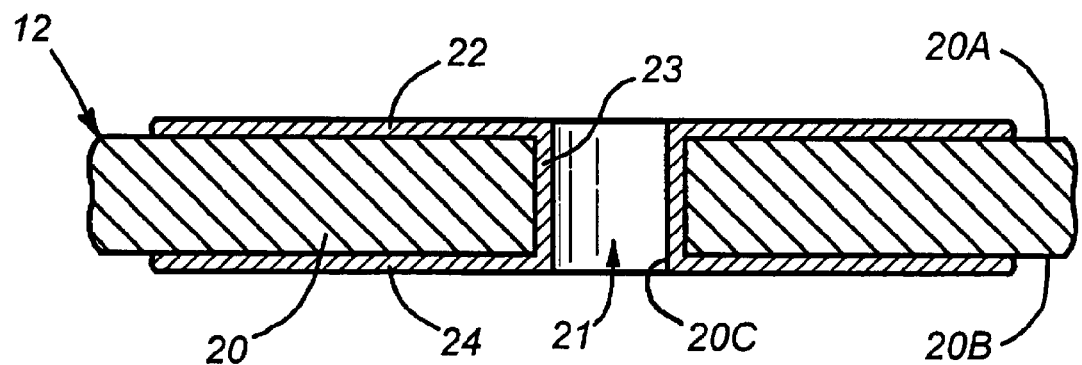
FIG. 3 is a cross sectional elevation view of a portion of the test plate as viewed in a vertical plane containing a line 3—3 in FIG. 1.

Turning now to FIG. 3, it shows further details of the test plate 12. The test plate 12 includes a DUT-holding structure 20 that defines at least one DUT-receiving hole 21. The DUT-holding structure 20 (a base) is composed of a metallic material (e.g., aluminum) that has oppositely facing first and second outer surfaces 20A and 20B. The DUT-holding structure 20 could be multilayered so long as the first and second outer surfaces 20A and 20B are metallic.

In a manner somewhat similar to that of the vacuum ring 11 described above, the test plate 12 includes means for improving abrasion resistance of the test plate in the form of a ceramic layer (e.g., alumina) having at least a first ceramic layer portion 22 that is disposed on the first outer surface 20A of the DUT-holding structure 20. Preferably, the first ceramic layer portion 22 is bonded to the first outer surface 20A by molecular adhesion using the micro-arc oxidation process described above for the vacuum ring 11 with the result that the ceramic layer portion 22 has a thickness in the range of 20 micrometers to 100 micrometers.

In addition, the test plate 12 includes an internal wall 20C that defines the DUT-holding hole 21. The ceramic layer includes a hole-covering second ceramic layer portion 23 that covers the internal wall 22C. Similarly, a third ceramic layer portion 24 covers the second outer surface 20B. That arrangement enables use of the the DUT-holding structure 20 as a guard layer that is held at a selected electrical potential for testing purposes, with the ceramic layer portions 22, 23, and 24 providing an electrically nonconductive layer. For further details of a test plate with one or more guard layers, refer to U.S. Patent Application 20030197500 published Oct. 23, 2003.

Figure 4:
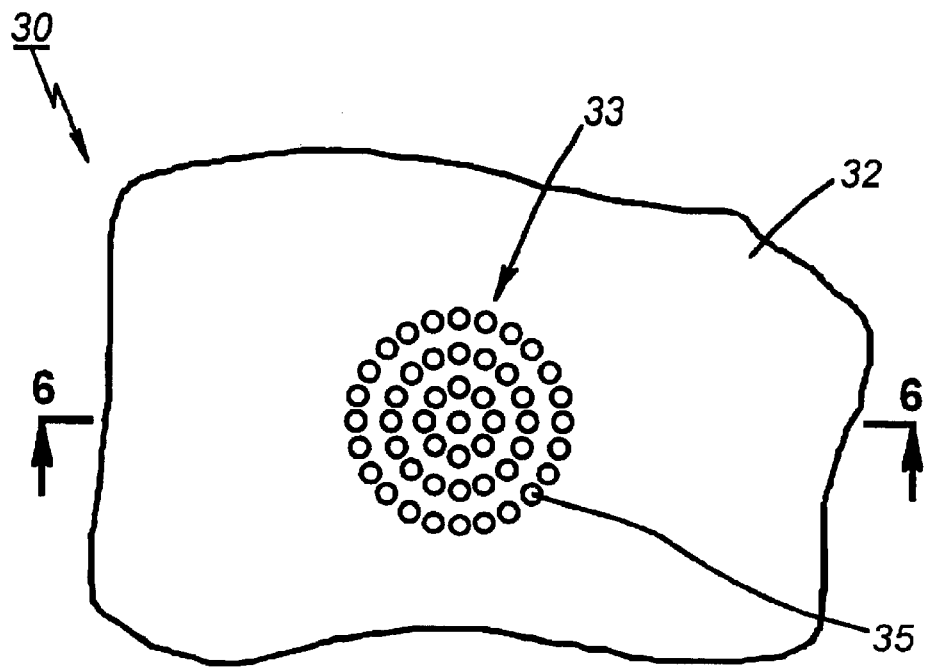
FIG. 4 is a top plan view of an eject hole portion of the vacuum ring showing an eject hole pattern according to the invention.
Figure 5:
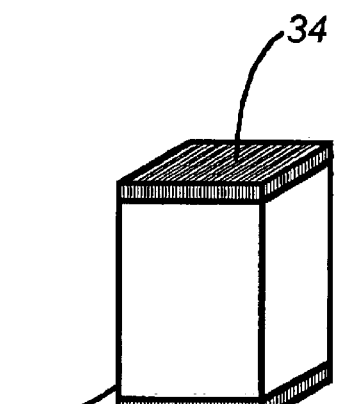
FIG. 5 is an isometric view of a typical DUT to be tested.
Figure 6:
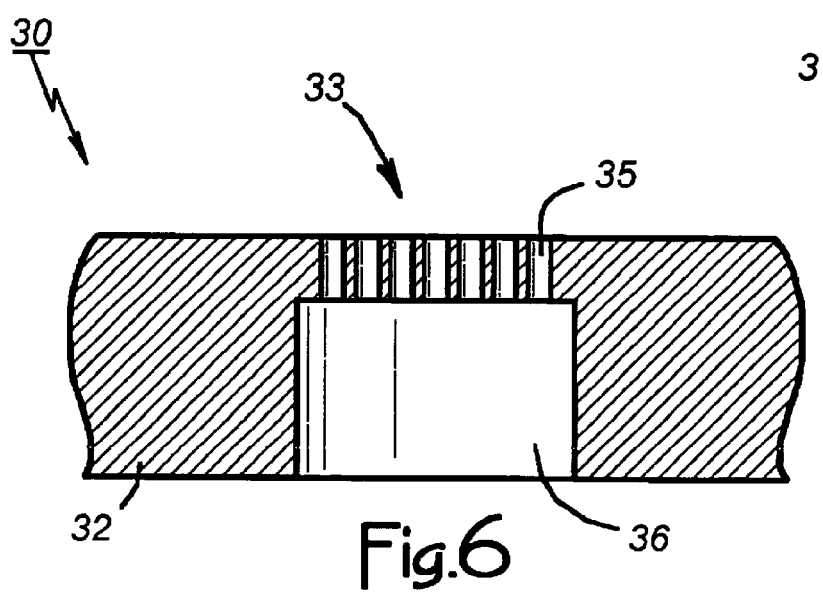
FIG. 6 is a cross sectional elevation view of the eject hole portion as viewed in a vertical plane containing a line 6—6 in FIG. 4.

FIGS. 4, 5, and 6 show details of a vacuum ring 30 constructed according to the eject-hole aspect of the invention. The vacuum ring 30 may be similar in many respects to the vacuum ring 11 described above, and the drawings are not to scale. The vacuum ring 30 is used in conjunction with a test plate on a component testing system (not shown in FIGS. 4–6) for testing DUTs (e.g., the DUT 31 in FIG. 5).

The vacuum ring 30 includes a base 32 with an eject hole pattern 33 for discharging compressed gas toward the DUTs in order to eject DUTs from the test plate. Each DUT to be held by the test plate has a cross sectional area and the eject hole pattern 33 is sized accordingly. The cross sectional area of the DUT 31 is identified in FIG. 5 by reference numeral 34 to indicate that to which "predetermined cross sectional area" refers. The DUT 31 is not drawn to scale. It is greatly enlarged in FIG. 5 relative to the eject hole pattern 33 for illustrative convenience and the DUT terminations are shaded.

The eject hole pattern 33 includes a plurality of forty-nine closely spaced-apart individual holes 35, only one hole 35 being identified in FIGS. 4 and 6 for illustrative convenience. The cross sectional area of each DUT to be tested (e.g., typically as small as 0.010" by 0.010") is greater than a predetermined minimum cross sectional area, and the hole pattern 33 is such that each of the individual holes 35 has a cross sectional area that is somewhat less than the predetermined cross sectional area (i.e., somewhat less than the size that would be large enough to receive a DUT having the predetermined minimum cross sectional area). The illustrated individual holes 35 are circular, but a hole pattern with holes having any of various other shapes may be used instead, including holes that are oval and elongate slots or spaced apart slits laser machined into the base 32. An airway 36 that is drilled, milled, or otherwise formed in the base 32 of the vacuum ring 30 (FIG. 6) serves to communicate compressed air to the individual holes 35.

In other words, the DUTs to be tested will not fit partially into the individual holes 35, and the number of holes a particular DUT occludes is dependent on the size of that particular DUT. Stated another way, the number of individual holes 35 of the hole pattern 33 that affect a particular DUT for DUT ejection purposes is dependent on the cross sectional size of that particular DUT. As a result, the vacuum ring 30 works with DUTs having significantly different sizes.

Figure 7:
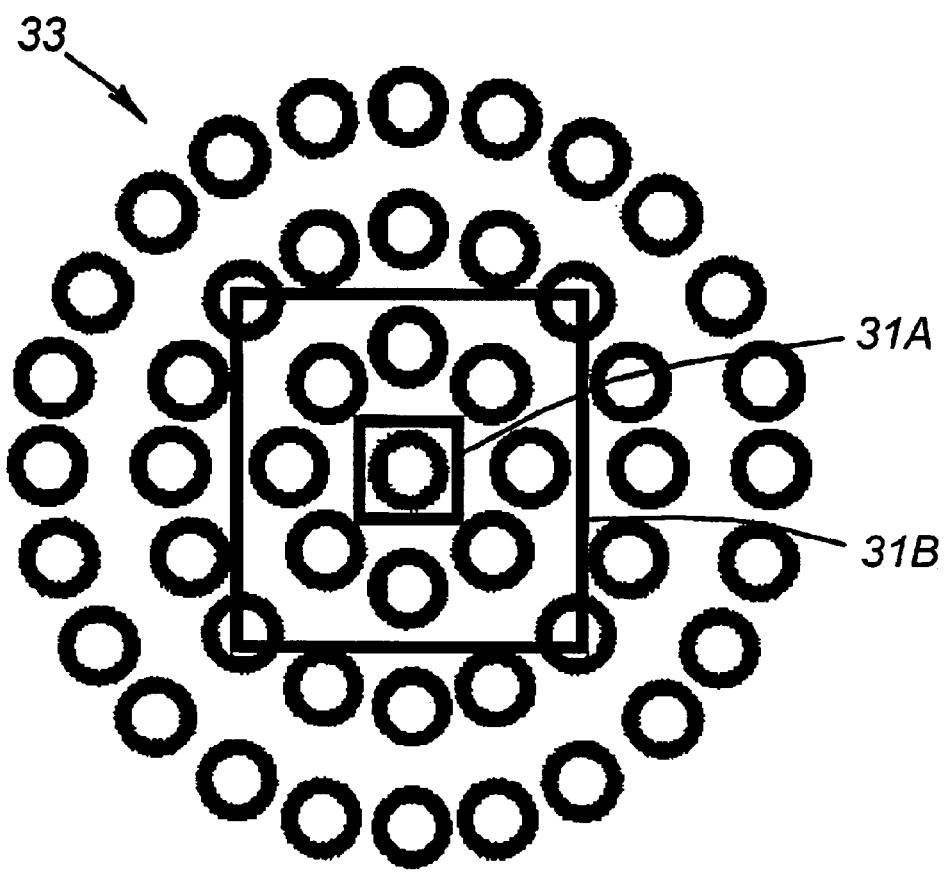
FIG. 7 is an enlarged diagrammatic representation of the eject hole pattern with two DUT sizes superimposed.
Figure 8:
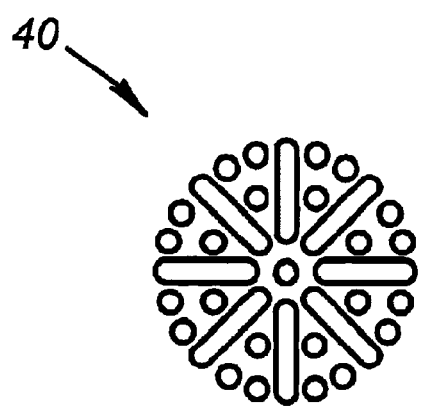
FIG. 8 is top plan view of another eject hole portion that combines circular holes and oblong holes.

FIG. 7 illustrates the foregoing. It is an enlarged diagrammatic representation of the eject hole pattern 33 with two different sized DUTs superimposed. A smaller first DUT 31A (the smaller square) covers just one eject hole so that a relatively small blast of air (i.e., ejection force) affects it for ejection purposes. A larger second DUT 31B (the larger square) fully covers nine eject holes and partially covers an additional four eject holes so that a relatively large blast of air affects it for ejection purposes. FIG. 8 is top plan view of an eject hole pattern 40 that combines circular holes and oblong holes.

Thus, the invention provides an improved vacuum ring and test plate construction such that the vacuum ring and test plate are more abrasion resistant, the vacuum ring is more arc-over proof, and differing DUT sizes are better accommodated. Although exemplary embodiments have been shown and described, one of ordinary skill in the art may make many changes, modifications, and substitutions without necessarily departing from the spirit and scope of the invention.

What is claimed is:

1. A vacuum ring for use in conjunction with a test plate on a component testing system for testing DUTs such that each DUT has a cross sectional area less than a predetermined minimum cross sectional area, the vacuum ring comprising:

a base; and means for ejecting DUTs from the test plate, said means including an eject hole pattern defined by the base for discharging compressed gas toward the DUTs;

wherein the eject hole pattern includes a plurality of closely spaced apart individual holes such that each of the individual holes has a cross sectional area that is less than the size that would be large enough to receive a DUT having the predetermined minimum cross sectional area; and wherein the base does not include a resistance heating element or a plasma generating electrode;

whereby the number of holes affecting a particular DUT for DUT ejection purposes is dependent on the cross sectional size of that particular DUT.

2. A vacuum ring as recited in claim 1, wherein the holes have uniform circular shapes with diameters of about five mils.

3. A vacuum ring as recited in claim 1, further comprising a ceramic layer on the base.

* * * * *